(12) United States Patent
Keilers et al.

(10) Patent No.: US 10,775,857 B2
(45) Date of Patent: Sep. 15, 2020

(54) FORCED CONVECTION COOLING SYSTEM

(71) Applicant: Dell Products L.P., Round Rock, TX (US)

(72) Inventors: Cyril Adair Keilers, Georgetown, TX (US); Shawn Paul Hoss, Georgetown, TX (US); Christopher Michael Helberg, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 15/973,203

(22) Filed: May 7, 2018

(65) Prior Publication Data

US 2019/0339748 A1    Nov. 7, 2019

(51) Int. Cl.
*G06F 1/20* (2006.01)
*H05K 7/20* (2006.01)

(52) U.S. Cl.
CPC .......... *G06F 1/20* (2013.01); *H05K 7/20145* (2013.01); *H05K 7/20154* (2013.01); *H05K 7/20172* (2013.01); *G06F 2200/201* (2013.01)

(58) Field of Classification Search
CPC ... H01L 23/427; H01L 23/467; H01L 23/367; G06F 1/20; G06F 1/203; G06F 1/206; G06F 1/181; G06F 2200/201; H05K 7/2039; H05K 7/20545; H05K 7/20409; H05K 7/20; H05K 7/20136; H05K 7/20127; H05K 7/20145; H05K 7/10154; H05K 7/20854; H05K 7/20963; F28D 2021/0028; F28F 3/02
USPC ..... 257/E23.088, E29.099, 712; 165/104.26, 165/104.33, 80.3; 361/695, 679.47, 361/679.54, 697, 694, 679.46, 679.48, 361/679.49, 690, 704, 709, 702
See application file for complete search history.

(56) References Cited

U.S. PATENT DOCUMENTS

| | | | | |
|---|---|---|---|---|
| 5,829,515 A * | 11/1998 | Jeffries | ........... | H05K 7/20409 165/80.3 |
| 6,088,223 A * | 7/2000 | Diemunsch | ........... | G06F 1/20 174/15.2 |
| 6,109,340 A * | 8/2000 | Nakase | ........... | H01L 23/467 165/121 |
| 6,239,970 B1 * | 5/2001 | Nakai | ........... | G06F 1/1616 165/185 |

(Continued)

*Primary Examiner* — Mandeep S Buttar
(74) *Attorney, Agent, or Firm* — Haynes and Boone, LLP

(57) ABSTRACT

A forced convection system includes a chassis defining a chassis housing and including an outer surface opposite the chassis housing. A forced convection device channel is defined by the chassis adjacent the outer surface and opposite the chassis housing. A heat dissipation structure extends from the chassis adjacent the outer surface, opposite the chassis housing, and adjacent the forced convection device channel. A first heat producing device is located in the chassis housing and engages the chassis immediately opposite the heat dissipation structure to allow the chassis and the heat dissipation structure to conduct heat generated by the first heat producing device. A forced convection device is located in the forced convection device channel, and produces a forced convective airflow past the heat dissipation structure to dissipate the heat generated by the first heat producing device and conducted by the chassis and the heat dissipation structure.

20 Claims, 14 Drawing Sheets

(56) References Cited

U.S. PATENT DOCUMENTS

| | | | |
|---|---|---|---|
| 2004/0080911 A1* | 4/2004 | Liu | H01L 23/467 |
| | | | 361/697 |
| 2006/0085204 A1* | 4/2006 | Montero | G06Q 10/00 |
| | | | 705/340 |
| 2008/0285231 A1* | 11/2008 | Fischer | H05K 7/20545 |
| | | | 361/690 |

* cited by examiner

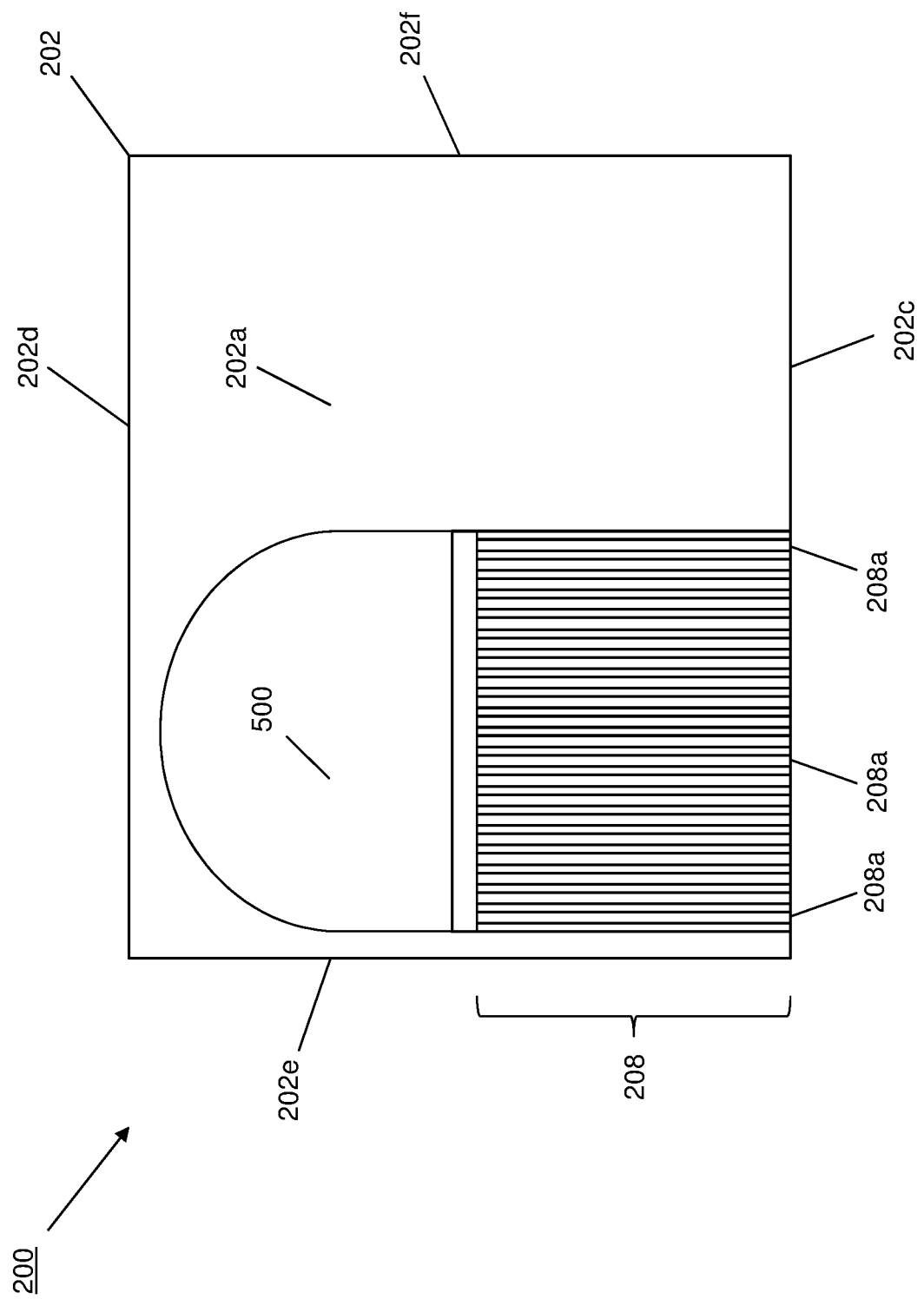

FORCED CONVECTION COOLING SYSTEM

The present disclosure relates generally to information handling systems, and more particularly to forced convective cooling of components in an information handling system.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

As information handling systems such as, for example, server devices, desktop computing devices, laptop/notebook computing devices, and/or other computing devices known in the art, includes components that require cooling. Furthermore, while some computing device components utilize passive cooling structures (e.g., heat sinks, head pipes, heat spreaders, etc.), many conventional computing device components have relatively high heat densities that require active cooling systems such as, for example, forced convection systems provided by fans, blowers, and/or other air/fluid moving devices known in the art. For example, processors in a chassis housing are often cooled using a heat sink in the chassis housing that engages the processor, along with a fan in the chassis housing that moves air over through the heat sink. However, those and other cooling solutions typically add to the computing device thickness (e.g., the stack including the computing device chassis, the motherboard, the processor, the heat sink, and/or other computing device components), which is undesirable.

Accordingly, it would be desirable to provide an improved forced convection cooling system.

SUMMARY

According to one embodiment, an Information Handling System (IHS) includes a chassis defining a chassis housing and including an outer surface that is opposite the chassis from the chassis housing, wherein the chassis housing includes a first portion that is configured to house a first heat producing device such that the first heat producing devices engages the chassis; a heat dissipation structure that extends from the chassis adjacent the outer surface and that is located immediately opposite the chassis from the first portion of the chassis housing that is configured to house the first heat producing device; and a forced convection device channel that is defined by the chassis adjacent the outer surface and that is located opposite the chassis from the chassis housing and adjacent the heat dissipation structure, wherein the force convective device channel is configured to house a forced convection device to allow the forced convection device to produce a forced convective airflow past the heat dissipation structure to dissipate the heat generated by the first heat producing device and conducted by the chassis and the heat dissipation structure.

BRIEF DESCRIPTION OF THE DRAWINGS

FIG. 5C is top view illustrating an embodiment of a forced convection device coupled to the forced convection system of FIGS. 2A, 2B, and 2C

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
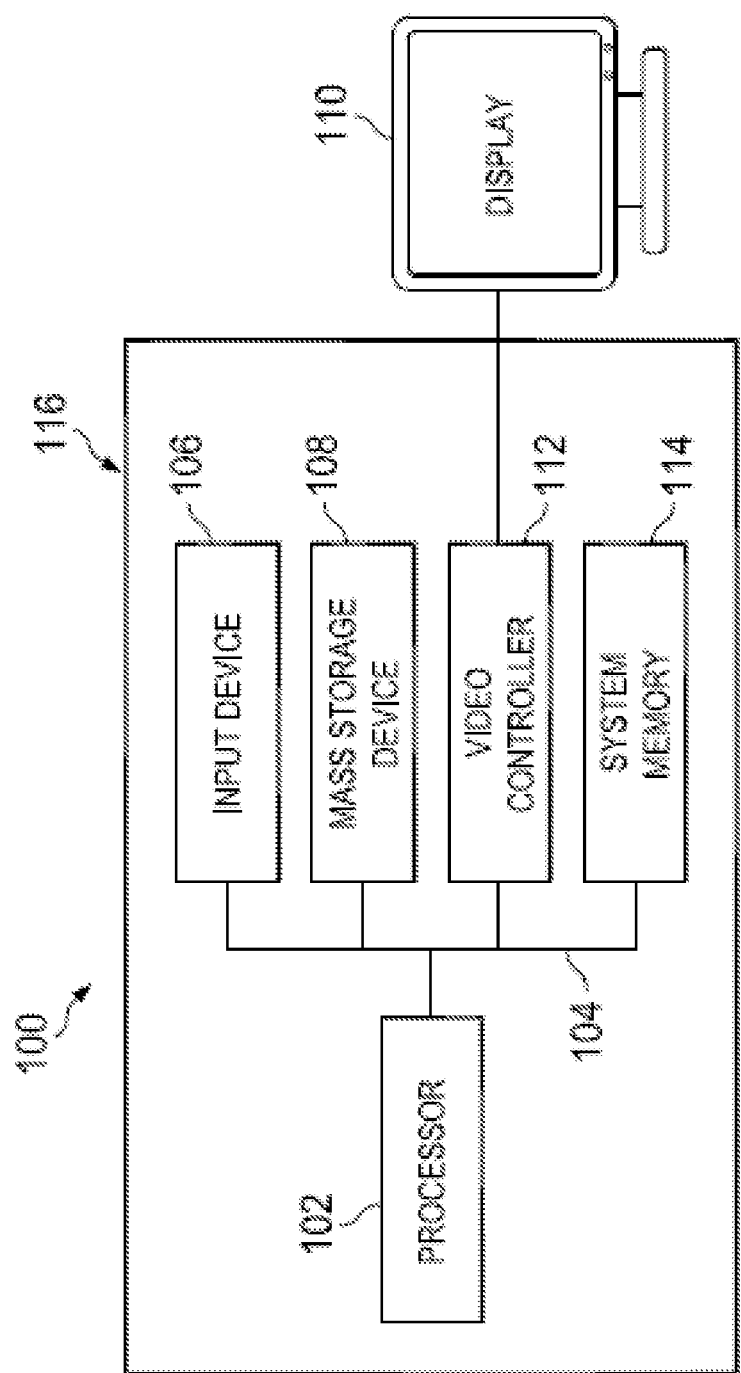
FIG. 1 is a schematic view illustrating an embodiment of an information handling system.

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2A:
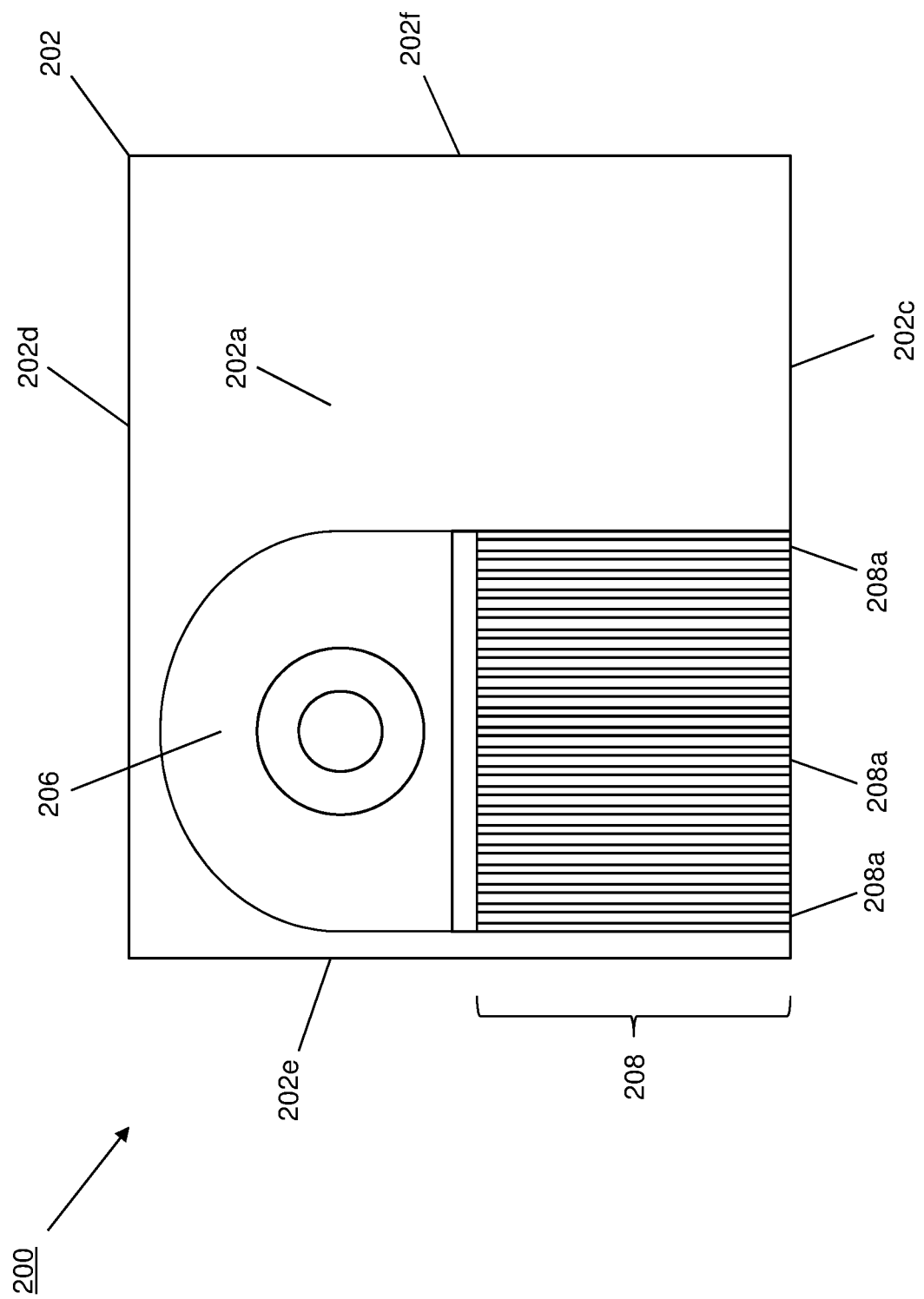
FIG. 2A is a top view illustrating an embodiment of a forced convection system.
Figure 2B:
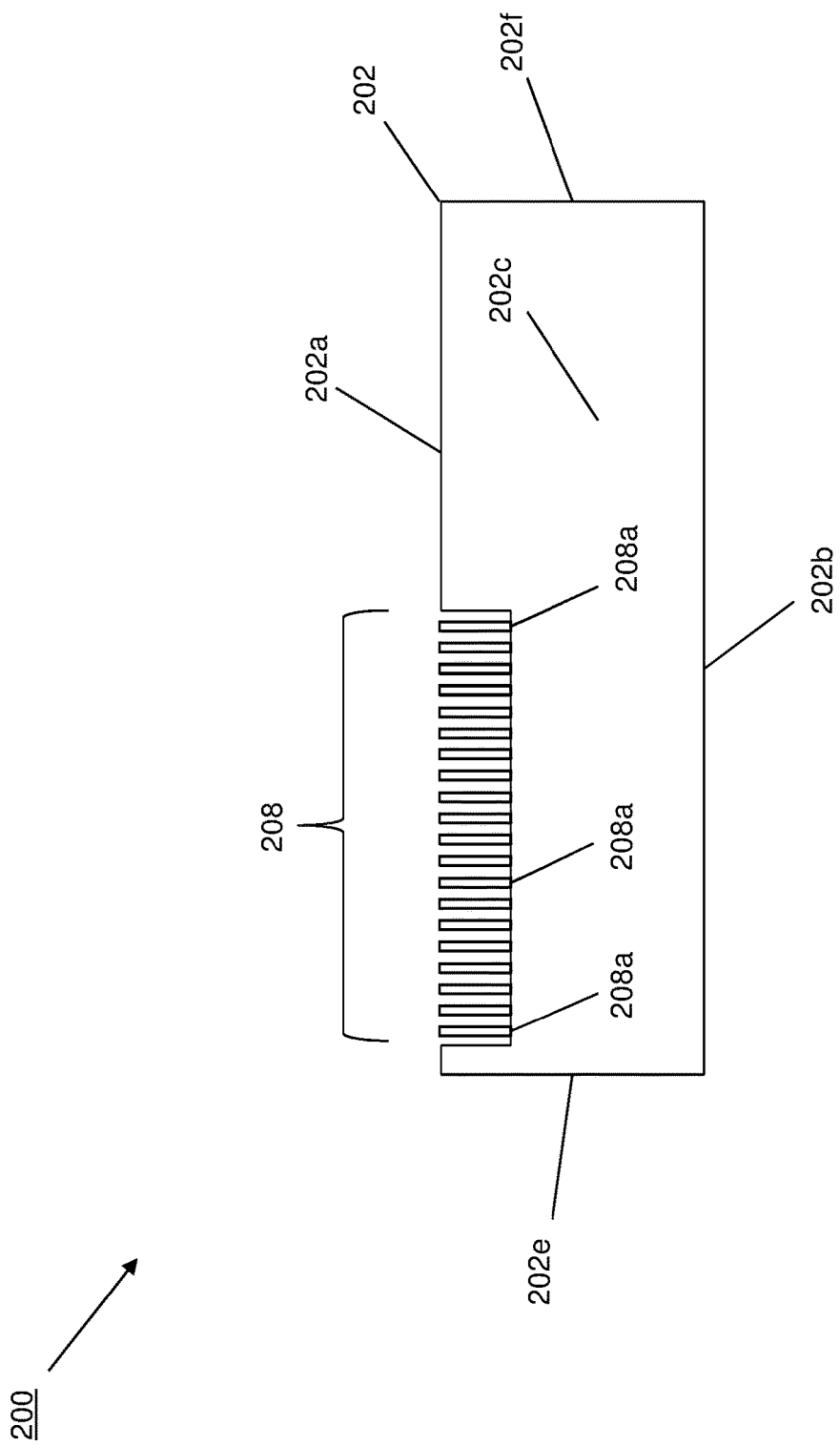
FIG. 2B is a front view illustrating an embodiment of the forced convection system of FIG. 2A.
Figure 2C:
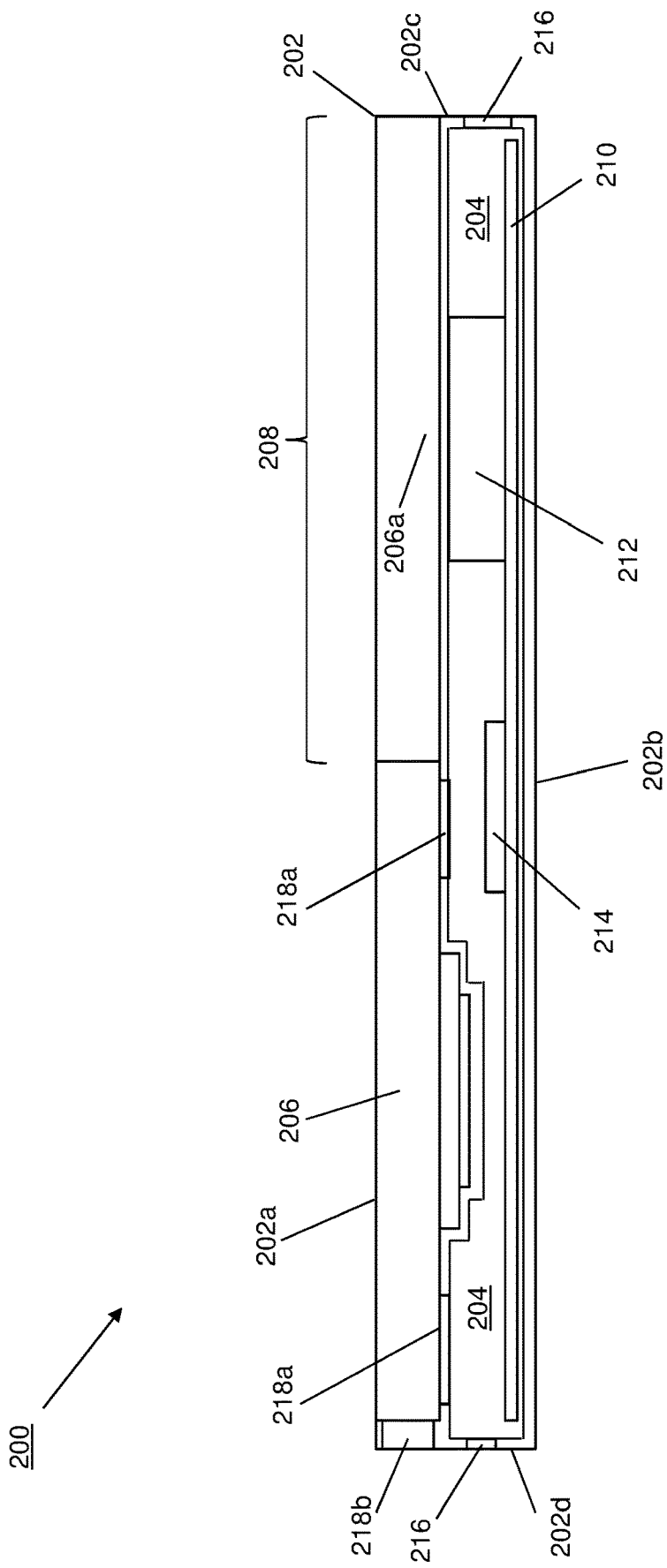
FIG. 2C is a cross-sectional view illustrating an embodiment of the forced convection system of FIGS. 2A and 2B.

Referring now to FIGS. 2A, 2B, and 2C, an embodiment of a forced convection system 200 is illustrated. In an embodiment, the forced convection system 200 may be provided with the IHS 100 of FIG. 1, and/or other devices that include some or all of the components of the IHS 100. However, the teaching of the present disclosure may be beneficial to a variety of devices and/or subsystems that require forced convective cooling, and thus those systems are envisioned as falling within the scope of the present disclosure as well. In the illustrated embodiment, the forced convection system 200 includes a chassis 202 that may house components (e.g., of the IHS 100), only some of which are illustrated in FIGS. 2A-C. The chassis 202 includes a top outer surface 202a, a bottom outer surface 202b that is located opposite the chassis 202 from the top outer surface 202a, a front outer surface 202c that extends between the top outer surface 202a and the bottom outer surface 202b, a rear outer surface 202d that is located opposite the chassis 202 from the front outer surface 202c and that extends between the top outer surface 202a and the bottom outer surface 202b, and a pair of opposing side outer surfaces 202e and 202f that are located opposite the chassis 202 from each other and that extend between the top outer surface 202a, the bottom outer surface 202b, the front outer surface 202c, and the rear outer surface 202d.

As illustrated in FIG. 2C, the chassis 202 defines a chassis housing 204 between the top outer surface 202a, the bottom outer surface 202b, the front outer surface 202c, the rear outer surface 202d, and the side outer surfaces 202e and 202f, and that chassis housing 204 may be utilized to house components (e.g., of the IHS 100). Furthermore, the chassis 202 defines a forced convection device channel 206 that is located adjacent the top outer surface 202a and opposite the wall of the chassis 202 (that includes the top outer surface 202a) from the chassis housing 204. As discussed in further detail below, the forced convection device channel 206 is configured to receive a force convection device (e.g., a fan, a blower, and/or other forced convection devices that would be apparent to one of skill in the art in possession of the present disclosure), and thus may include connecting, securing, and/or other coupling features (not illustrated for clarity), as well as the air inlets defined by the chassis 202 to provide a source of air for the force convection device when it is positioned in the forced convection device channel 206.

A heat dissipation structure 208 extends from the chassis 202 adjacent the top outer surface 202a of the chassis 202, is located opposite the wall of the chassis 202 (that includes the top outer surface 202a) from the chassis housing 204, and adjacent the forced convection device channel 206. In the illustrated embodiment, the heat dissipation structure 208 includes a plurality of spaced apart heat dissipation fins 208a that extend from the top outer surface 202a of the chassis 202 and between the forced convection device channel 206 and the front outer surface 202c of the chassis 202 in order to define a plurality of airflow channels (i.e., between the heat dissipation fins 208a) extending from the forced convection device channel 206. As such, in some embodiments, the heat dissipation structure of the present disclosure may be considered to be integrated with the chassis 202 (e.g., formed as part of one or more chassis walls that define a chassis housing, or provided via other integration techniques that would be apparent to one of skill in the art in possession of the present disclosure.) However, one of skill in the art in possession of the present disclosure will recognize that other heat dissipation structures and/or heat dissipation structure configurations will fall within the scope of the present disclosure as well.

As can be seen in FIG. 2C, the components housed in the chassis housing 204 may include a board 210 (e.g., a motherboard) to which a first heat producing device 212 and a second heat producing device 214 are mounted. In some embodiments, the first heat producing device 212 may be provided by a relatively high heat density device such as, for example, a processing system (e.g., a Central Processing Unit (CPU)), a memory system (e.g., Dynamic Random Access Memory (DRAM) devices), and/or a variety of other high heat density devices that would be apparent to one of skill in the art in possession of the present disclosure. In some embodiments, the second heat producing device 214 may be a relatively low heat density device that is configured to produce less heat than the high heat density device, although in other embodiments, the first and second heat producing devices may be provided by any heat producing devices that would be apparent to one of skill in the art in possession of the present disclosure.

As can be seen in FIG. 2C, the first heat producing device 212 directly engages the wall of the chassis 202 that defines the top outer surface 202a of the chassis 202 upon which the heat dissipation structure 208 is located (e.g., from which the heat dissipation fins 208a extend in the illustrated embodiment.) While not illustrated, one of skill in the art in possession of the present disclosure will recognize that the first heat producing device 212 may engage the chassis 202 through a thermal substrate such as, for example, a heat transfer paste or other thermal substrates known in the art. Furthermore, the second heat providing component 212 does not directly engage the chassis 202 in the illustrated embodiment, although embodiments in which more than one heat producing devices engage the chassis 202a opposite one or more heat dissipation structures will fall within the scope of the present disclosure as well. In the illustrated embodiment, a plurality of chassis housing air inlets 216 are defined by the walls of the chassis 202 that include the front outer surface 202c and the rear outer surface 202d and, as discussed below, are configured to allow air to be drawn from outside the chassis 202 and into the chassis housing 204. Furthermore, a plurality of forced convection device air inlets 218a and 218b are defined by the walls of the chassis 202 that also define the forced convection device channel 206, with the forced convection device air inlets 218a configured to allow air to be drawn from the chassis housing 204 and into a forced convection device when it is located in the forced convection device channel 206, and the forced convection device air inlet(s) 218b configured to allow air to be drawn from outside the chassis 202 and into the forced convection device when it is located in the forced convection device channel 206. However, while specific air inlets have been illustrated and described, one of skill in the art in possession of the present disclosure will recognize that air inlets for the forced convection system 200 may be located in a variety of locations that will fall within the scope of the present disclosure. Furthermore, while a specific forced convection system has been described, forced convection systems may include different components and/or configurations that will fall within the scope of the present disclosure as well.

Figure 3A:
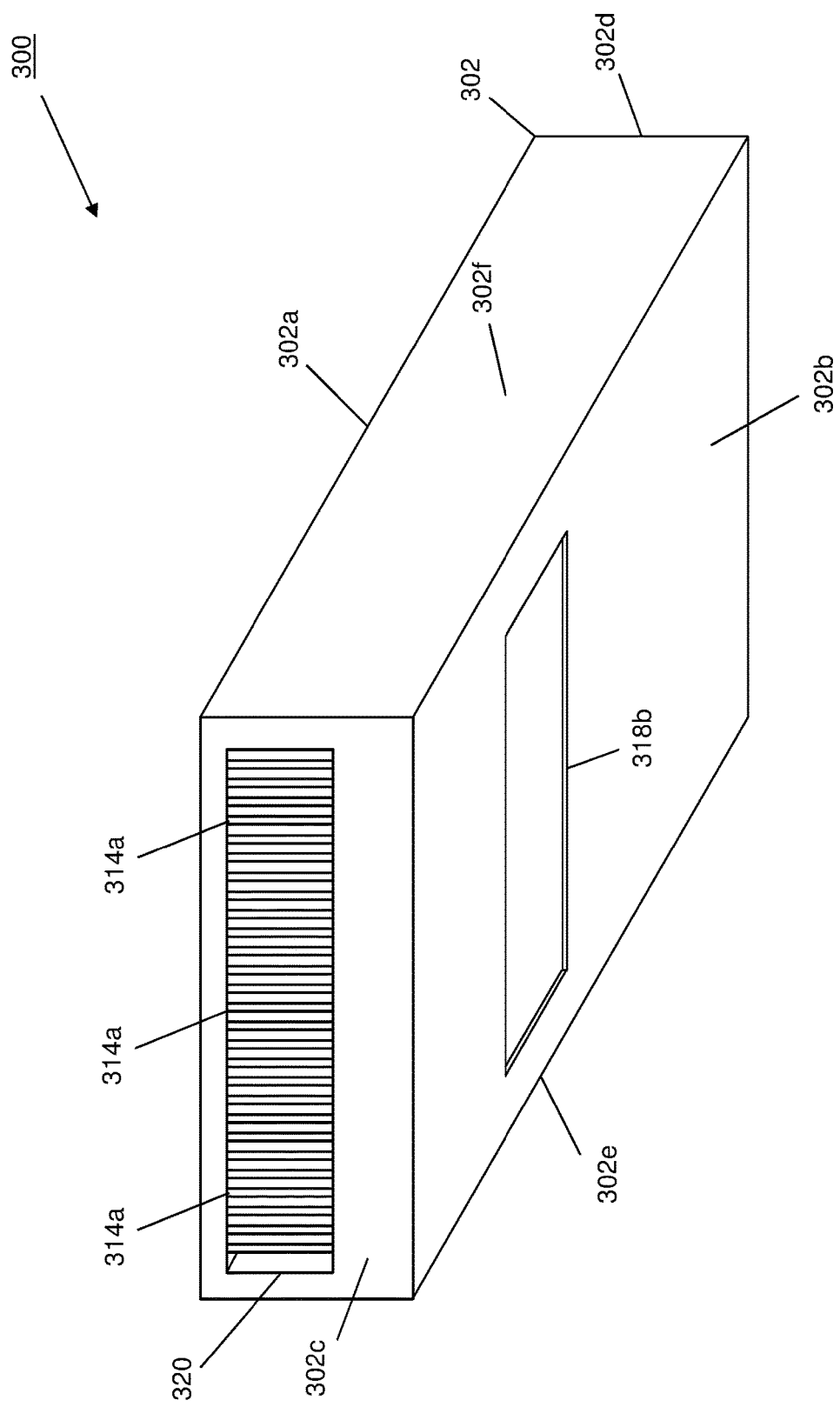
FIG. 3A is a perspective view illustrating an embodiment of a forced convection system.
Figure 3B:
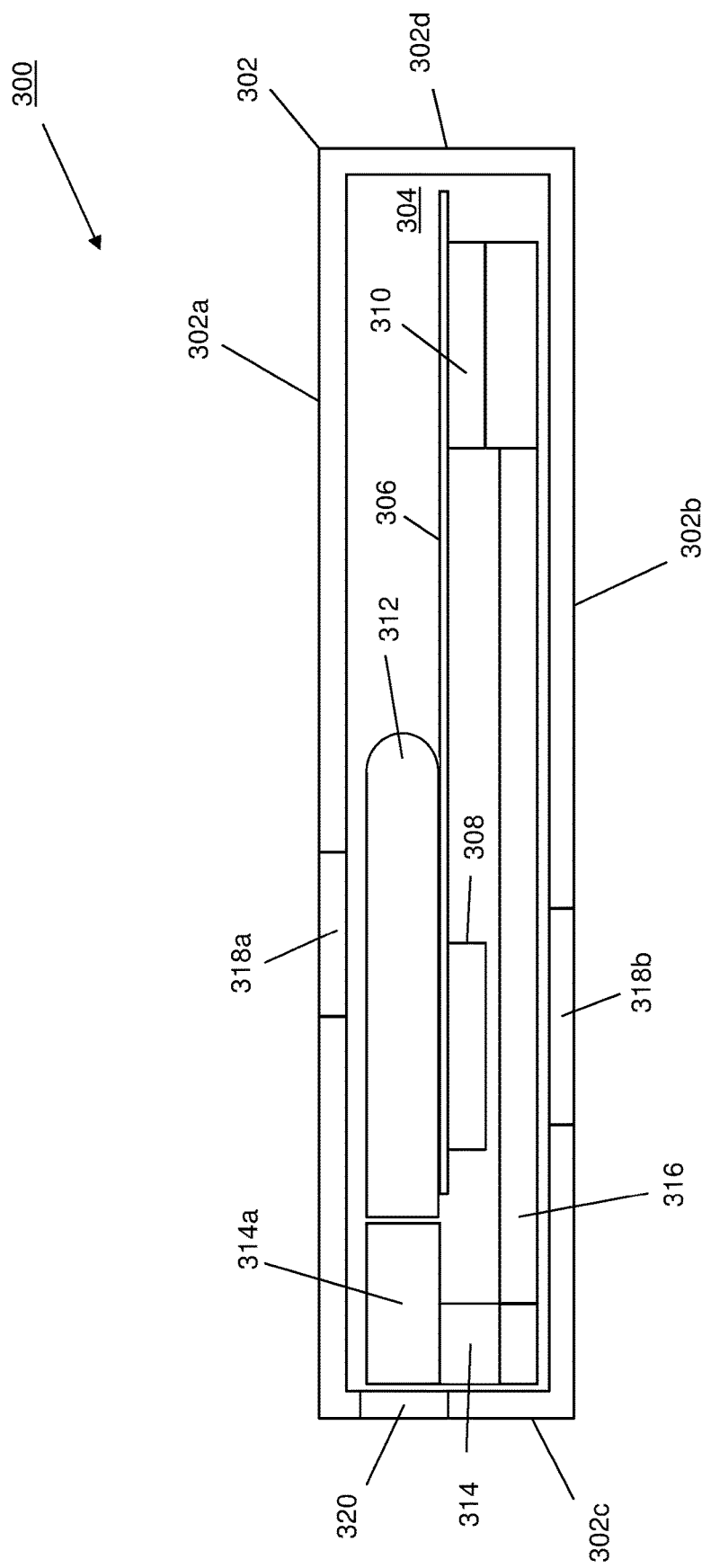
FIG. 3B is a cross-sectional side view illustrating an embodiment of the forced convection system of FIG. 3A.
Figure 3C:
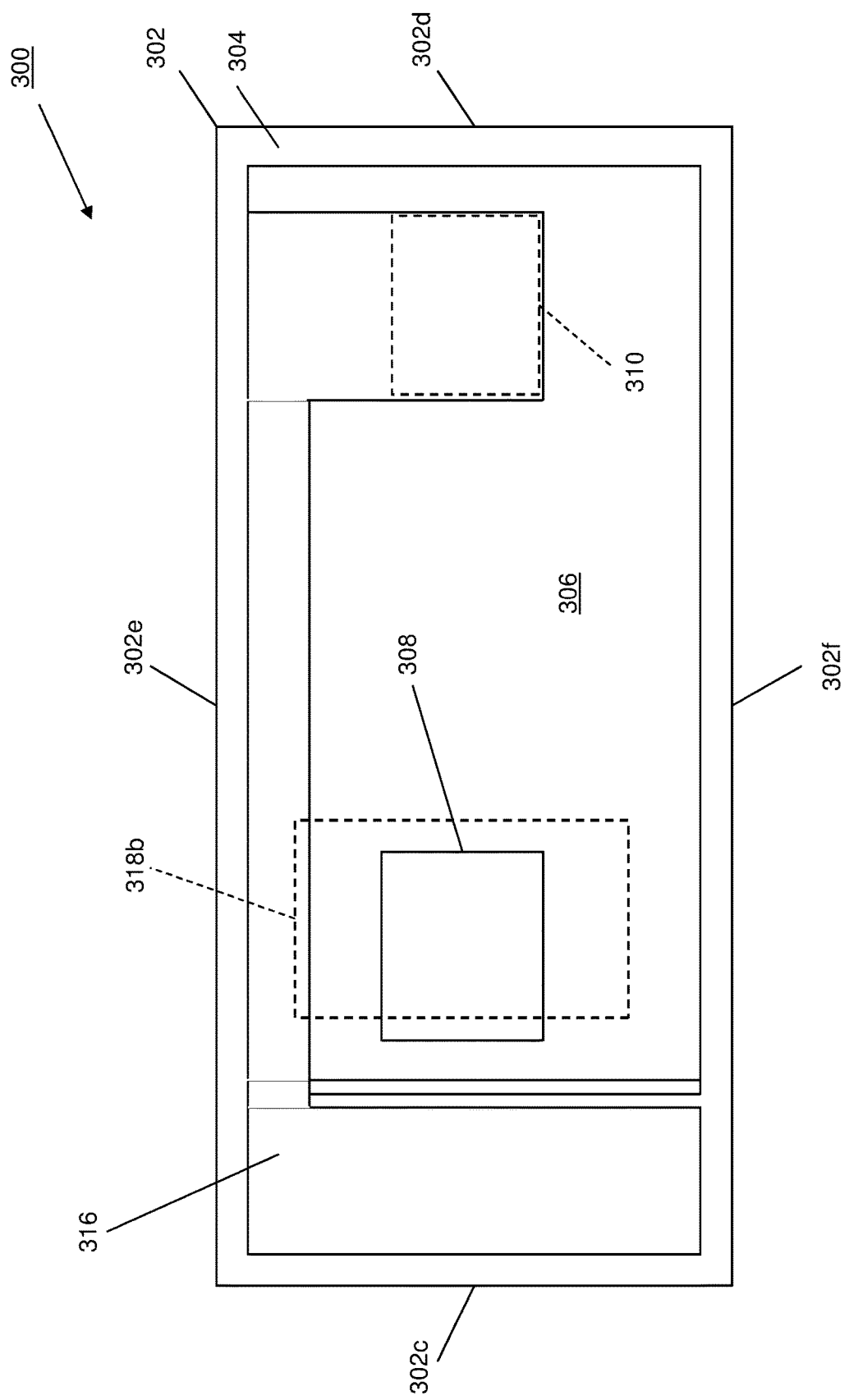
FIG. 3C is a cross-sectional bottom view illustrating an embodiment of the forced convection system of FIGS. 3A and 3B.

Referring now to FIGS. 3A, 3B, and 3C, an embodiment of a forced convection system 300 is illustrated. While illustrated and described separately, as discussed below, features of the forced convection systems 200 and 300 of the present disclosure may be combined in a single system. In an embodiment, the forced convection system 300 may be provided with the IHS 100 of FIG. 1, and/or other devices that include some or all of the components of the IHS 100. However, the teaching of the present disclosure may be beneficial to a variety of devices and/or subsystems that require forced convective cooling, and thus those systems are envisioned as falling within the scope of the present disclosure as well. In the illustrated embodiment, the forced convection system 300 includes a chassis 302 that may house components (e.g., of the IHS 100), only some of which are illustrated in FIGS. 3A-C. The chassis 302 includes a top outer surface 302a, a bottom outer surface 302b that is located opposite the chassis 302 from the top outer surface 302a, a front outer surface 302c that extends between the top outer surface 302a and the bottom outer surface 302b, a rear outer surface 302d that is located opposite the chassis 302 from the front outer surface 302c and that extends between the top outer surface 302a and the bottom outer surface 302b, and a pair of opposing side outer surfaces 302e and 302f that are located opposite the chassis 302 from each other and that extend between the top outer surface 302a, the bottom outer surface 302b, the front outer surface 302c, and the rear outer surface 302d.

As illustrated in FIGS. 3B and 3C, the chassis 302 defines a chassis housing 304 between the top outer surface 302a, the bottom outer surface 302b, the front outer surface 302c, the rear outer surface 302d, and the side outer surfaces 302e and 202f, and that chassis housing 304 may be utilized to house components (e.g., of the IHS 100). As can be seen in FIGS. 3B and 3C, the components housed in the chassis housing 304 may include a board 306 (e.g., a motherboard) to which a first heat producing device 308 and a second heat producing device 310 are mounted. In some embodiments, the first heat producing device 308 and/or the second heat producing device 310 may be provided by, for example, a processing system (e.g., a Central Processing Unit (CPU)), a memory system (e.g., Dynamic Random Access Memory (DRAM) devices), and/or a variety of other high heat density devices that would be apparent to one of skill in the art in possession of the present disclosure. However, in other embodiments, the first and second heat producing devices may be provided by any heat producing devices that would be apparent to one of skill in the art in possession of the present disclosure.

In the illustrated embodiment, a forced convection device 312 is located on the board 306 and in chassis housing 304 between the board 306 and the wall of the chassis 302 that includes the top outer surface 302a. The forced convection device 312 may be provided by a fan, a blower, and/or other forced convection devices that would be apparent to one of skill in the art in possession of the present disclosure. A heat dissipation structure 314 is located in the chassis housing 304 adjacent the forced convection device 312, and in the illustrated embodiment includes a plurality of spaced apart heat dissipation fins 314a that define a plurality of airflow channels (i.e., between the heat dissipation fins 314a) extending from the forced convection device 312. A heat transfer device 316 (e.g., a heat pipe or other heat transfer subsystem) is located in the chassis housing 304, engages the heat dissipation structure 314, and extends through the chassis housing 304 and into engagement with the second heat producing device 310. As would be understood by one of skill in the art in possession of the present disclosure, the heat transfer device 316 may be configured to transfer heat generated by the second heat producing device 310 to the heat dissipation structure 314, and in the illustrated embodiment does not engage the first heat producing device 308. However, heat transfer devices that engage the first heat producing device 308 are envisioned as falling within the scope of the present disclosure as well.

In the illustrated embodiment, a plurality of chassis housing air inlets 318a and 318b are defined by the walls of the chassis 302 that include the top outer surface 302a and the bottom outer surface 302b, respectively. As discussed below, the chassis housing air inlet 318a is configured to allow air to be drawn from outside the chassis 302 and into the chassis housing 204 to the forced convection device 312, while the chassis housing air inlet 318b provides an airflow entrainment aperture that is configured to allow air to be drawn from outside the chassis 302, into the chassis housing 204, and past the first heat producing device 308 via entrainment produced by a primary airflow generated by the forced convection device 312. Furthermore, a forced convection device air outlet 320 is defined by the wall of the chassis 302 that includes the front outer surface 302c of the chassis 302, and is located immediately adjacent the heat dissipation fins 314a and opposite the heat dissipation fins 314a from the forced convection device 312. As discussed below, the forced convection device 312 is configured to produce a primary airflow that is directed through the channels defined by the heat dissipation fins 314a, and out the forced convection device air outlet 320, and that primary airflow results in a secondary airflow being generated through the chassis housing air inlet 318b/airflow entrainment aperture via entrainment in order to cool the first heat producing device 308. However, while specific air inlets and outlets have been illustrated and described, one of skill in the art in possession of the present disclosure will recognize that air inlets and outlets for the forced convection system 300 may be located in a variety of locations that will fall within the scope of the present disclosure. Furthermore, while a specific forced convection system has been described, forced convection systems may include different components and/or configurations that will fall within the scope of the present disclosure as well.

Figure 4:
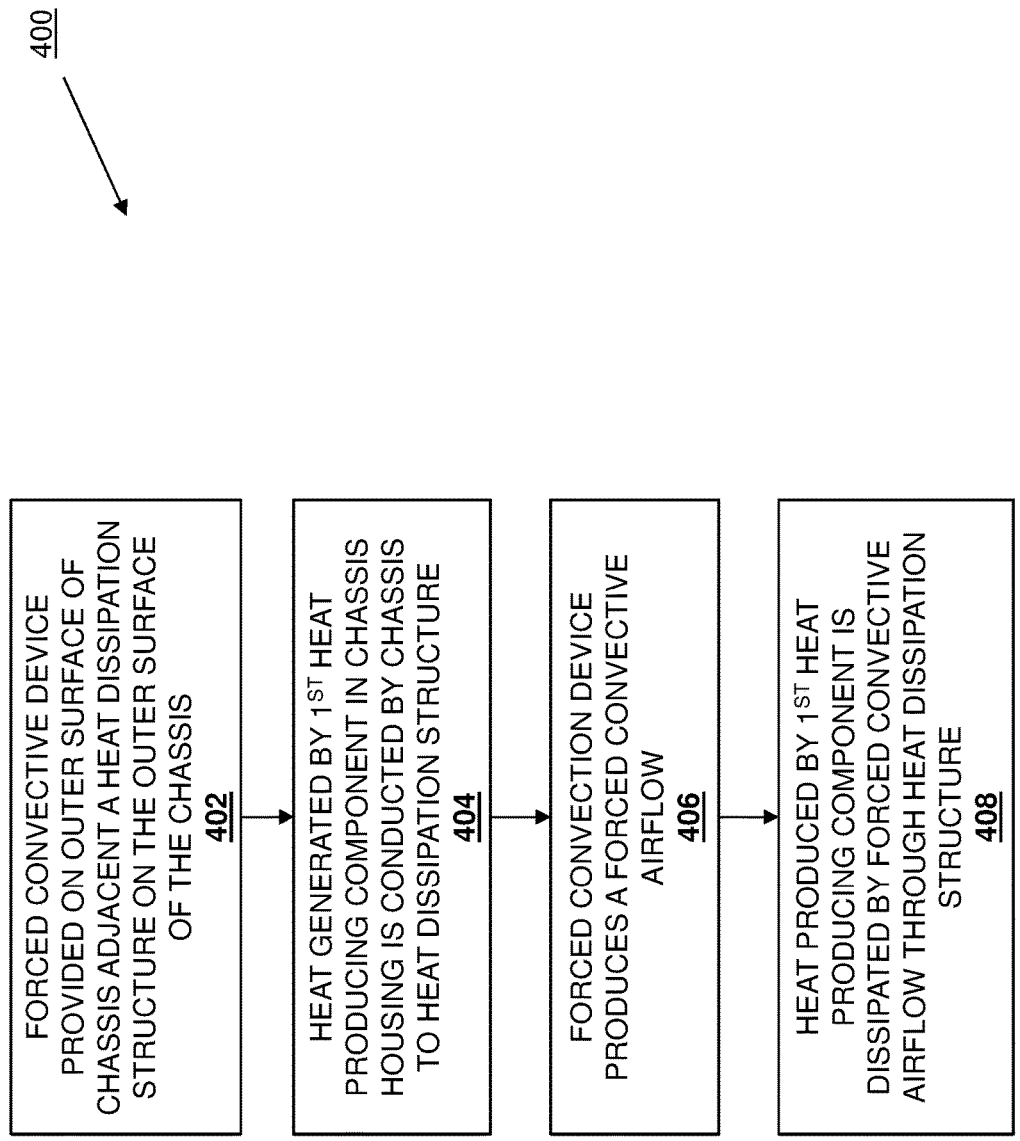
FIG. 4 is a flow chart illustrating an embodiment of a method for providing forced convective cooling.

Referring now to FIG. 4, an embodiment of a method 400 for providing forced convective cooling is illustrated. As discussed above, embodiments of the systems and methods of the present disclosure may provide a chassis with an outer surface having an integrated heat dissipation structure and a forced convection device mounting area adjacent the integrated heat dissipation structure. High heat density heat producing device(s) housed in the chassis may be engaged with the wall of the chassis that is opposite the integrated heat dissipation structure to allow heat generated by the heat producing device(s) to be conducted via the chassis and the integrated heat dissipation structure, and operation of a forced convection device mounted to the forced convection device mounting area produces an airflow past the integrated heat dissipation structure to dissipate heat generated by the heat producing device and conducted by the chassis and the integrated heat dissipation structure. The systems and methods of the present disclosure reduce the computing device thickness (e.g., the stack including the computing device chassis, the motherboard, the processor, the heat dissipation structure, and/or other computing device components) relative to conventional systems, while ensuring cooling of high heat density components in the computing device.

Figure 5A:
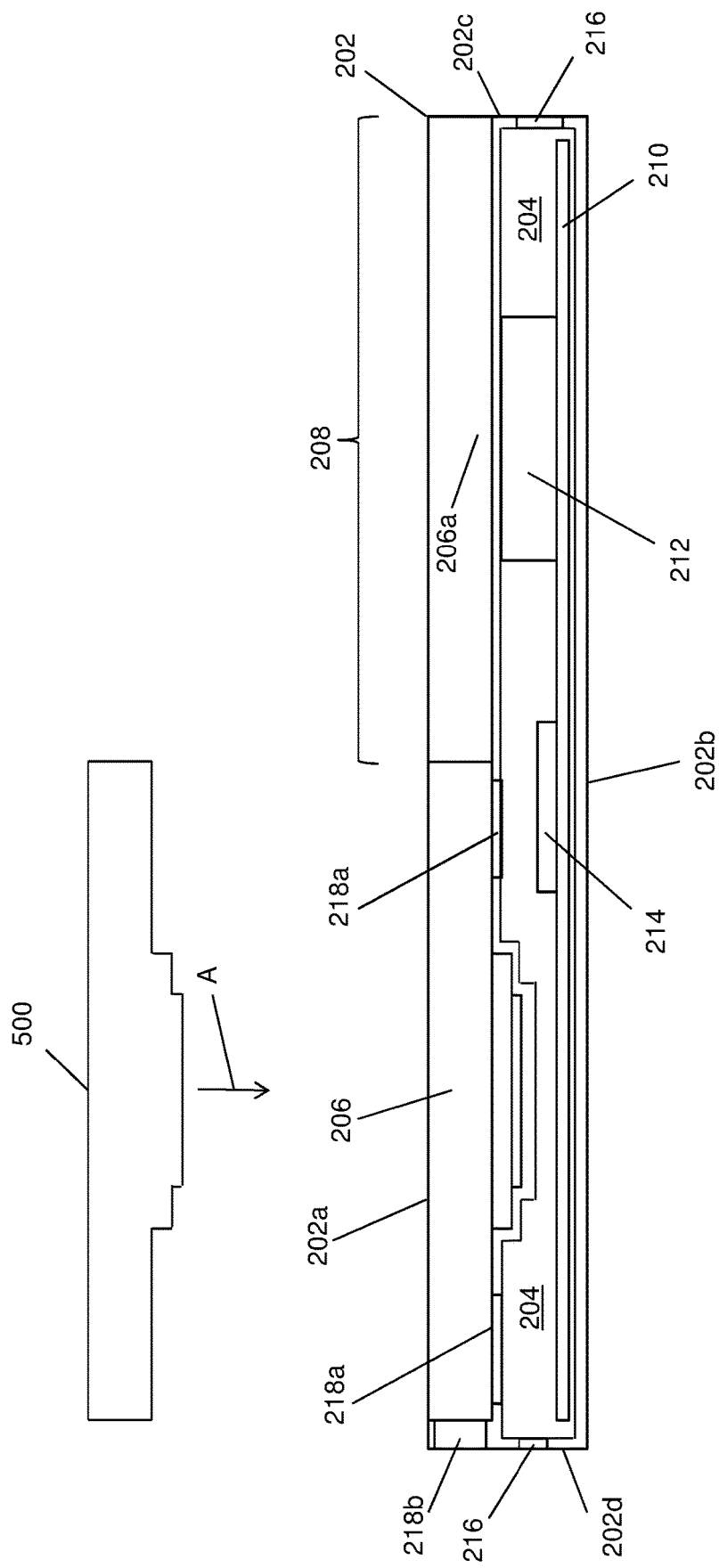
FIG. 5A is partial cross-sectional view illustrating an embodiment of a forced convection device being coupled to the forced convection system of FIGS. 2A, 2B, and 2C.
Figure 5B:
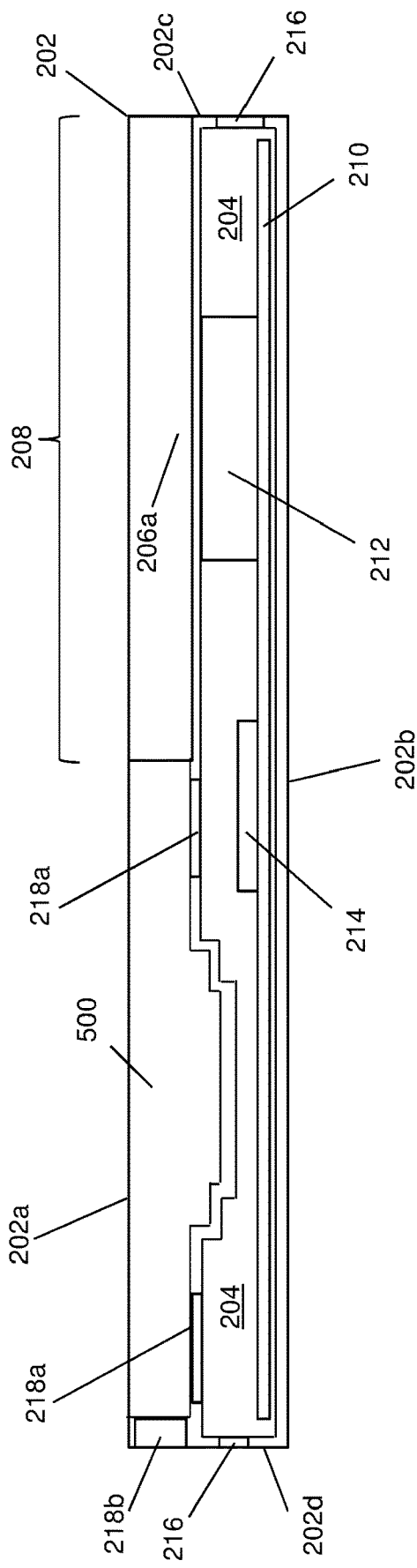
FIG. 5B is partial cross-sectional view illustrating an embodiment of a forced convection device coupled to the forced convection system of FIGS. 2A, 2B, and 2C.

The method 400 begins at block 402 where a forced convection device is provided on an outer surface of a chassis and adjacent a heat dissipation structure on the outer surface of the chassis. In an embodiment, at block 402, a forced convection device 500 such as, for example, a fan device, a blower device, and/or other forced convection devices that would be apparent to one of skill in the art in possession of the present disclosure, may be positioned in the forced convection device channel 206 defined by the chassis 202 of FIGS. 2A, 2B, and 2C. For example, with reference to FIGS. 5A, 5B, and 5C, the forced convection device 500 may be positioned adjacent the forced convection device channel 206 and moved in a direction A until the forced convection device 500 is located in the forced convection device channel 206. While not illustrated, one of skill in the art in possession of the present disclosure will recognize that the chassis 202 may include power connections (plugs, cabling, etc.), mounting features, and/or other components for securing the forced convection device 500 to the chassis 202 and enabling the operation of the forced convection device 500 discussed below.

The method 400 then proceeds to block 404 where heat generated by a first heat producing device in a chassis housing of the chassis is conducted by the chassis to the heat dissipation structure. In an embodiment, at block 404, the first heat producing device 212 may be operated such that it produces heat by, for example, operating a processing system that provides the first heat producing device 212, operating a memory system that provides the heat producing device 212, and/or operating any other heat producing device in a manner that would be apparent of skill in the art in possession of the present disclosure. Operation of the first heat producing device 212 causes the first heat producing device 212 to produce heat, and the engagement of the first heat producing device 212 and the chassis 202 (e.g., the wall of the chassis immediately opposite the heat dissipation structure 208) causes that heat to be conducted by the chassis 202 and the heat dissipation structure 208 (e.g., the heat dissipation fins 208a in the heat dissipation structure of the illustrated embodiment.) Furthermore, one of skill in the art in possession of the present disclosure will recognize that the heat generated by the first heat generating component may be conducted by thermal substrates such as, for example, the heat transfer paste discussed above as being provided between the first heat producing device 212 and the chassis 202.

Figure 6:
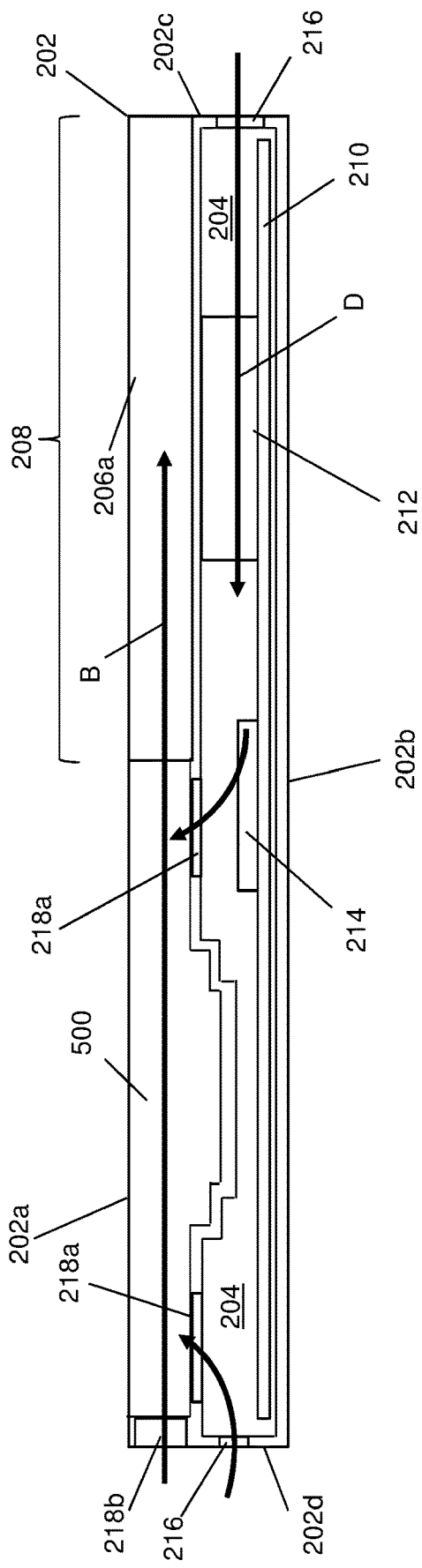
FIG. 6 is a partial cross-sectional view illustrating an embodiment of airflow generated by the forced convection device coupled to the forced convection system of FIGS. 2A, 2B, and 2C.

The method 400 then proceeds to block 406 where the forced convection device produced a forced convective airflow. In an embodiment, at block 406, the force convection device 500 may be activated to produce a forced convective airflow. With reference to FIG. 6, a forced convective airflow B is illustrated that may be produced by the operation of the forced convection device 500. In particular, the embodiment of FIG. 6 illustrates how the operation of the forced convection device 500 may cause air to be drawn from outside the chassis 202 and through the chassis housing air inlets 216 to the chassis housing 204, as well as air to be drawn from the chassis housing 204 and through the forced convection device air inlets 218a, and from outside the chassis 202 and through the forced convection device air inlets 218b, and to the forced convection device 500 in order to produce the forced convective airflow B.

The method 400 then proceeds to block 408 where the heat provided by the first heat producing device is dissipated by the forced convective airflow through the heat dissipation structure. In an embodiment, at block 408, the forced convective airflow B produced by the forced convection device 500 travels past the heat dissipation structure 206 (e.g., through the airflow channels defined between the heat dissipation fins 208a), and one of skill in the art in possession of the present disclosure will appreciate that such the forced convective airflow B operates to dissipate the heat that was generated by the first heat producing device 212 and conducted through the chassis 202 and the heat dissipation structure 212. Furthermore, one of skill in the art in possession of the present disclosure will appreciate that the air drawn through the chassis housing 204 (e.g., the air that is provided to the forced convection device 500 via the forced convection device air inlets 218a) may travel over components in the chassis housing 204 (e.g., the second heat producing device 214) to dissipate heat generated by those components as well.

Thus, systems and methods have been described that provide a chassis with an integrated heat dissipation structure and a forced convection device mounting area on its outer surface. High heat density heat producing device(s) that are housed in the chassis are engaged with the wall of the chassis that is opposite the integrated heat dissipation structure to allow heat generated by the heat producing device(s) to be conducted via the chassis and the integrated heat dissipation structure, and operation of a forced convection device mounted to the forced convection device mounting area produces an airflow past the integrated heat dissipation structure to dissipate heat generated by the heat producing device and conducted by the chassis and the integrated heat dissipation structure. Such systems and methods of the present disclosure reduce the computing device thickness (e.g., the stack including the computing device chassis, the motherboard, the processor, the heat dissipation structure, and/or other computing device components) relative to conventional systems, while ensuring cooling of high heat density components in the computing device. One of skill in the art in possession of the present disclosure will recognize that the heat dissipation structure 208 may become relatively hot during operation of the forced convection system 200, and thus the chassis 202 may be mounted against a bracket, stand, or other structure in a computing device in a manner that prevents access to the heat dissipation structure 208 (e.g., prevents a user from touching the heat dissipation structure.)

Figure 7:
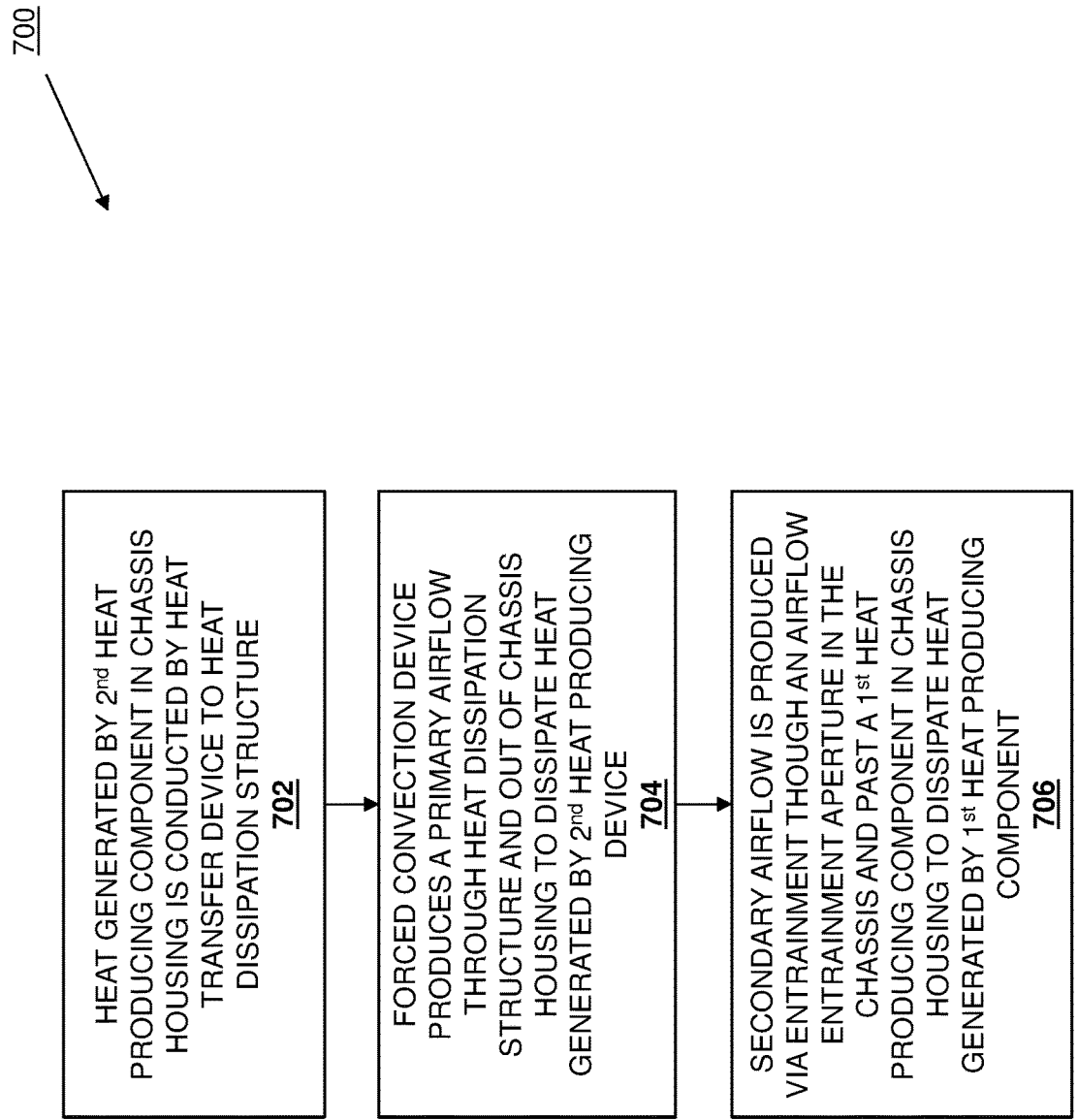
FIG. 7 is a flow chart illustrating an embodiment of a method for providing forced convective cooling.

Referring now to FIG. 7, an embodiment of a method 700 for providing forced convective cooling is illustrated. As discussed above, the systems and methods of the present disclosure provide a chassis defining an airflow entrainment aperture adjacent a high heat density heat producing device that is located in a chassis housing. A forced convection device in the chassis housing may be configured to produce a primary airflow through the chassis housing and out of the chassis via an airflow outlet, and that primary airflow may operate to create a secondary airflow through the airflow entrainment aperture via entrainment, with that secondary airflow configured to cool the heat producing device adjacent the airflow entrainment aperture. The systems and methods of the present disclosure reduce the computing device thickness (e.g., the stack including the computing device chassis, the motherboard, the processor, the heat dissipation structure, and/or other computing device components) relative to conventional systems, while ensuring cooling of high heat density components in the computing device.

The method 700 begins at block 702 where heat generated by a second heat producing device in a chassis housing defined by a chassis is conducted by a heat transfer device to a heat dissipation structure. In an embodiment, at block 702, the second heat producing device 310 may be operated such that it produces heat by, for example, operating a processing system that provides the first heat producing device 310, operating a memory system that provides the heat producing device 310, and/or operating any other heat producing device in a manner that would be apparent of skill in the art in possession of the present disclosure. Operation of the second heat producing device 310 causes the second heat producing device 310 to produce heat, and the engagement of the second heat producing device 310 and the heat transfer device 316 causes that heat to be conducted by the heat transfer device 316 to the heat dissipation structure 314 (e.g., to the heat dissipation fins 314a in the heat dissipation structure 314 of the illustrated embodiment.) Furthermore, one of skill in the art in possession of the present disclosure will recognize that the heat generated by the second heat producing device 310 may be conducted by thermal substrates such as, for example, the heat transfer paste discussed above that may be provided between heat producing devices and the heat transfer devices.

Figure 8:
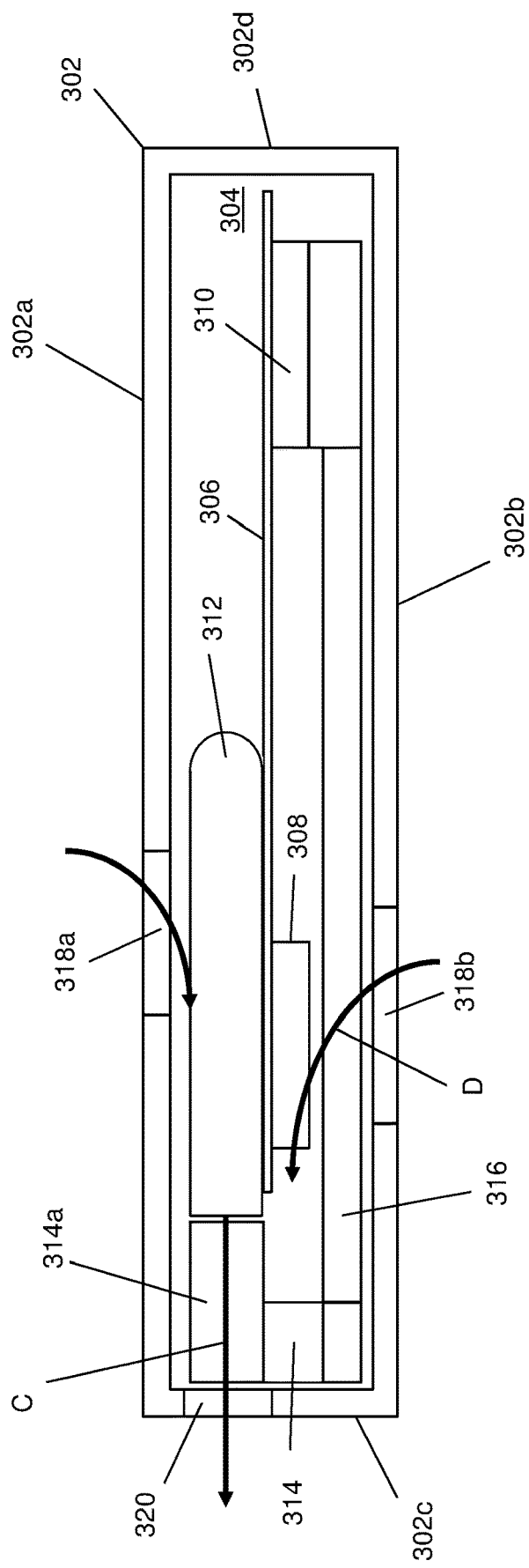
FIG. 8 is a partial cross-sectional view illustrating an embodiment of airflow generated by the forced convection device in the forced convection system of FIGS. 3A, 3B, and 3C

The method 700 then proceeds to block 704 where a forced convection device produces a primary airflow through the heat dissipation structure and out of the chassis housing to dissipate heat generated by the second heat producing device. In an embodiment, at block 704, the force convection device 312 may be activated to produce a primary airflow. With reference to FIG. 8, a primary airflow C is illustrated that may be produced by the operation of the forced convection device 312. In particular, the embodiment of FIG. 8 illustrates how the operation of the forced convection device 312 may cause air to be drawn from outside the chassis 302 and through the chassis housing air inlet 318a to the chassis housing 304 and the forced convection device 312 in order to produce the primary airflow C. The primary airflow C produced by the forced convection device 312 travels past the heat dissipation structure 314 (e.g., through the airflow channels defined between the heat dissipation fins 314a), and one of skill in the art in possession of the present disclosure will appreciate that the primary airflow C operates to dissipate the heat that was generated by the second heat producing device 310 and conducted through the heat transfer device 316 and the heat dissipation structure 314.

The method 700 then proceeds to block 706 where a secondary airflow is produced via entrainment through an airflow entrainment aperture in the chassis and past a first heat producing device in the chassis housing to dissipate heat generated by the first heat producing device. In an embodiment, at block 706 and as illustrated in FIG. 8, the primary airflow C operates to entrain a secondary airflow D through the airflow entrainment aperture/chassis housing air inlet 318b and past the first heat producing device 308 in order to dissipate heat generated by the first heat producing device 308. As discussed above, features of the forced convection system 300 may be included in the forced convection system 200. For example, the forced convection system 200 may include a heat producing device adjacent an airflow entrainment aperture (i.e., similar to the first heat producing component 308 and the airflow entrainment aperture 318b), and the operation of the forced convection device 500 may produce a primary/forced convective airflow (e.g., the airflow B illustrated in FIG. 6) through the heat dissipation structure 208 that also causes a secondary airflow to be created through the airflow entrainment aperture to cool its adjacent heat producing component.

Thus, systems and methods have been described that provide a chassis with an airflow entrainment aperture adjacent a high heat density heat producing device. The operation of a forced convection device in the chassis produces a primary airflow through the chassis and out an airflow outlet, and that primary airflow creates a secondary airflow through the airflow entrainment aperture via entrainment. That secondary airflow operates cool the heat producing device adjacent the airflow entrainment aperture. The systems and methods of the present disclosure reduce the computing device thickness (e.g., the stack including the computing device chassis, the motherboard, the processor, the heat dissipation structure, and/or other computing device components) relative to conventional systems, while ensuring cooling of high heat density components in the computing device Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A forced convection system, comprising:
  a chassis that includes an inner surface that defines a chassis housing and that includes an outer surface that is opposite the chassis from the inner surface;
  a forced convection device channel that is defined by the chassis adjacent the outer surface and that is located opposite the chassis from the inner surface;
  a heat dissipation structure that extends from the chassis adjacent the outer surface and that is located opposite the chassis from the chassis housing and adjacent the forced convection device channel, wherein the forced convection device channel is defined by the chassis on the same outer surface from which the heat dissipation structure extends;
  a first heat producing device that is located in the chassis housing and that engages the chassis immediately opposite the heat dissipation structure to allow the heat dissipation structure to conduct heat generated by the first heat producing device via the chassis; and a forced convection device that is located in the forced convection device channel, wherein the forced convection device is configured to draw air from the chassis housing and into the forced convection device to produce at least a portion of a forced convective airflow past the heat dissipation structure to dissipate the heat generated by the first heat producing device and conducted by the heat dissipation structure via the chassis.

2. The system of claim 1, wherein the heat dissipation structure includes a plurality of heat dissipation fins that extend from the chassis adjacent the outer surface and opposite the chassis from the chassis housing.

3. The system of claim 1, further comprising:
a second heat producing device that is located in the chassis housing.

4. The system of claim 3, wherein the forced convection device is configured to draw air past the second heat producing device to dissipate heat generated by the second heat producing device in order to produce the forced convective airflow past the heat dissipation structure.

5. The system of claim 3, further comprising:
an airflow entrainment aperture defined by the chassis adjacent the second heat producing device, wherein production of the forced convective airflow by the forced convection device is configured to draw air through the airflow entrainment aperture and past the second heat producing device to dissipate heat generated by the second heat producing device.

6. The system of claim 1, wherein the first heat producing device is a processing system.

7. An Information Handling System (IHS), comprising:
a chassis that includes an inner surface that defines a chassis housing and that includes an outer surface that is opposite the chassis from the inner surface, wherein the chassis housing includes a first portion that is configured to house a first heat producing device such that the first heat producing devices engages the chassis;

a heat dissipation structure that extends from the chassis adjacent the outer surface and that is located immediately opposite the chassis from the first portion of the chassis housing that is configured to house the first heat producing device, wherein the forced convection device channel is defined by the chassis on the same outer surface from which the heat dissipation structure extends;

a forced convection device channel that is defined by the chassis adjacent the outer surface and that is located opposite the chassis from the chassis housing and adjacent the heat dissipation structure, wherein the forced convective device channel is configured to house a forced convection device to allow the forced convection device to produce a forced convective airflow past the heat dissipation structure to dissipate the heat generated by the first heat producing device and conducted by the heat dissipation structure via the chassis; and a forced convection device air inlet that is defined by a portion of the chassis that also defines the forced convection device channel, wherein the forced convection device air inlet is configured to allow air to be drawn from the chassis housing and into the forced convection device to produce at least a portion of the forced convection airflow.

8. The IHS of claim 7, wherein the heat dissipation structure includes a plurality of heat dissipation fins that extend from the chassis adjacent the outer surface and opposite the chassis from the chassis housing.

9. The IHS of claim 7, wherein the chassis housing includes a second portion that is configured to house a second heat producing device.

10. The IHS of claim 9, wherein the forced convective device channel and the forced convection device are inlet are configured to allow the forced convection device to draw air past the second heat producing device to dissipate heat generated by the second heat producing device in order to produce the forced convective airflow past the heat dissipation structure.

11. The IHS of claim 9, further comprising:
an airflow entrainment aperture defined by the chassis adjacent the second portion of the chassis housing that is configured to house the second heat producing device, wherein the forced convective device channel is configured such that the production of the forced convective airflow by the forced convection device draws air through the airflow entrainment aperture and past the second heat producing device to dissipate heat generated by the second heat producing device through the forced convection device air inlet.

12. The IHS of claim 7, wherein the first heat producing device is a processing system.

13. The IHS of claim 7, wherein the first heat producing device is a memory system.

14. A method for providing forced convective cooling, comprising:
generating, by a first heat producing device that is located in a chassis housing defined by an inner surface of a chassis and that engages a portion of the chassis, heat;
conducting, via the chassis by a heat dissipation structure that extends from the chassis adjacent an outer surface of the chassis and immediately opposite the chassis from the portion of the chassis that engages the first heat producing device, the heat;
drawing, by a forced convection device that is positioned in a forced convection device channel that is defined by the chassis adjacent the outer surface and that is located opposite the chassis from the inner surface and adjacent the heat dissipation structure, air from the chassis housing and into the forced convection device;
producing, by the forced convection device using the air drawn from the chassis housing, a forced convective airflow, wherein the forced convection device channel is defined by the chassis on the same outer surface from which the heat dissipation structure extends; and
dissipating, via the forced convective airflow, the heat generated by the first heat producing device and conducted by the heat dissipation structure via the chassis.

15. The method of claim 14, wherein the heat dissipation structure includes a plurality of heat dissipation fins that extend from the chassis adjacent the outer surface and opposite the chassis from the chassis housing.

16. The method of claim 14, further comprising:
generating, by a second heat producing device that is located in the chassis housing defined by the chassis, heat.

17. The method of claim 16, further comprising:
allowing the forced convection device to draw air past the second heat producing device to dissipate heat generated by the second heat producing device that is included in the air drawn from the chassis housing in order to produce the forced convective airflow past the heat dissipation structure.

18. The method of claim 16, wherein the production of the forced convective airflow by the forced convection device draws air through an airflow entrainment aperture defined by the chassis and past the second heat producing device to dissipate heat generated by the second heat producing device.

19. The method of claim 14, wherein the first heat producing device is a processing system.

20. The method of claim 14, wherein the first heat producing device is a memory system.

* * * * *